(12) United States Patent
Son et al.

(10) Patent No.: US 9,214,348 B2
(45) Date of Patent: Dec. 15, 2015

(54) SEMICONDUCTOR DEVICE INCLUDING A GATE DIELECTRIC LAYER

(71) Applicant: SK hynix Inc., Icheon-si Gyeonggi-do (KR)

(72) Inventors: Young Jin Son, Seoul (KR); Dong Seok Kim, Seoul (KR); Jin Yul Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 507 days.

(21) Appl. No.: 13/845,206

(22) Filed: Mar. 18, 2013

(65) Prior Publication Data

US 2014/0061780 A1 Mar. 6, 2014

(30) Foreign Application Priority Data

Aug. 31, 2012 (KR) .................. 10-2012-0096289

(51) Int. Cl.
| | |
|---|---|
| H01L 21/3205 | (2006.01) |
| H01L 21/28 | (2006.01) |
| H01L 29/78 | (2006.01) |
| H01L 27/108 | (2006.01) |
| H01L 29/66 | (2006.01) |

(52) U.S. Cl.
CPC .... *H01L 21/28008* (2013.01); *H01L 27/10876* (2013.01); *H01L 27/10879* (2013.01); *H01L 29/66795* (2013.01); *H01L 29/7827* (2013.01); *H01L 29/7851* (2013.01)

(58) Field of Classification Search
CPC .................................................. H01L 21/3205
See application file for complete search history.

(56) References Cited

U.S. PATENT DOCUMENTS

| | | | |
|---|---|---|---|
| 7,678,651 | B2 | 3/2010 | Nam |
| 7,923,331 | B2 | 4/2011 | Han et al. |

FOREIGN PATENT DOCUMENTS

KR 1020100106017 A 10/2010

*Primary Examiner* — Marvin Payen
(74) *Attorney, Agent, or Firm* — William Park & Associates Ltd.

(57) ABSTRACT

A semiconductor device is fabricated by, inter alia, forming a sacrificial liner on an active portion of a semiconductor substrate, oxidizing the sacrificial liner to transform the sacrificial liner into a gate dielectric layer, and forming a gate on the gate dielectric layer.

14 Claims, 11 Drawing Sheets

SEMICONDUCTOR DEVICE INCLUDING A GATE DIELECTRIC LAYER

CROSS-REFERENCE TO RELATED APPLICATION

The present application claims priority under 35 U.S.C. 119(a) to Korean Application No. 10-2012-0096289, filed on Aug. 31, 2012, in the Korean Intellectual Property Office, which is incorporated herein by reference in its entirety as set forth in full.

BACKGROUND

The present disclosure generally relates to semiconductor technology, and more particularly to semiconductor devices including gate dielectric layers of transistors and methods of fabricating the same.

Semiconductor devices including integrated circuits have been employed in various electronic systems. The integrated circuits of the semiconductor devices include a plurality of transistors, and a lot of effort has been attempted to increase the number of the transistors formed in a limited area of the semiconductor substrate for increasing an integrated density. The transistors may be determined based on dimension of active portions of the semiconductor substrate to be formed in the transistor. As the transistors are scaled down, the dimensions of active portions have been reduced. As the dimensions of the active portions are reduced, the transistors may seriously suffer from a narrow width effect and a short channel effect.

A gate dielectric layer in the transistors may be formed of an oxide layer which is grown by thermally oxidizing the active portions of the semiconductor substrate. During the thermal oxidation of the active portions, silicon atoms in the active portions may be bonded to oxygen atoms to cause a silicon loss phenomenon. As a result, widths of the active portions (for example, an active portion corresponding to a gate length), that is, channel widths of the transistors may be reduced. Reduction of the channel widths of the transistors may lead to increase of channel resistance ($R_{ch}$) of the transistors. Even if the transistors are turned on, drain current of the transistors may be reduced to degrade characteristics of the transistors.

Each of dynamic random access memory (DRAM) devices includes a plurality memory cells, and each of the memory cells includes a single cell transistor and a single cell capacitor connected to the single cell transistor. As the channel widths of the cell transistors are reduced, the channel resistance of the cell transistor increases to reduce a sensing margin of a cell current that flows through bit line electrically connected to the cell transistor. The silicon loss phenomenon in the active portions may make it difficult to accurately control a thickness of the gate dielectric layer of the cell transistors. The silicon loss phenomenon may significantly degrade the characteristics of the memory cell transistors which are formed using a high process technology with a minimum feature size of 20 nanometers or less.

SUMMARY

According to an embodiment, a method of fabricating a semiconductor device includes forming a sacrificial liner on an active portion of a semiconductor substrate, oxidizing the sacrificial liner to form a gate dielectric layer, and forming a gate on the gate dielectric layer.

According to an embodiment, a method of fabricating a semiconductor device includes forming an isolation layer in a semiconductor substrate to define an active portion and forming a gate trench that crosses the active portion and extends into the isolation layer to have a first bottom surface in the active portion and a second bottom surface in the isolation layer. The second bottom surface is lower than the first bottom surface to provide an active fin portion below the first bottom surface in the gate trench. A sacrificial liner is formed on an inner surface of the gate trench. The sacrificial liner is oxidized to form a gate dielectric layer. A gate layer is formed on the gate dielectric layer.

According to an embodiment, a semiconductor device includes a gate dielectric layer formed by oxidizing a sacrificial line and disposed on an active portion of a semiconductor substrate. A gate is disposed on a surface of the gate dielectric layer opposite to the active portion.

According to an embodiments a method of fabricating a semiconductor device includes forming trenches in a semiconductor substrate, forming a sacrificial liner along an inner surface of the trenches, treating the sacrificial liner using the radical source excited by an energy to form a gate dielectric layer, forming a gate on the gate dielectric layer to be filled in inner portions of the gate trenches.

In an embodiment, the method may further include forming a gate trench in the active portion. In such a case, the sacrificial liner may be formed to cover an inner surface of the gate trench and the gate may be formed in the gate trench.

In an embodiment, the method may further include removing one portion of the sacrificial liner to leave the other portion of the sacrificial liner on sidewalls of the gate trench and to expose a bottom surface of the gate trench before the gate dielectric layer is formed. During the oxidation process, the bottom surface of the gate trench may be oxidized to form a first portion of the gate dielectric layer and the sacrificial liner left on the sidewalls of the gate trench may be oxidized to form a second portion of the gate dielectric layer. A thickness of the second portion may be greater than that of the first portion.

In an embodiment, removing the one portion of the sacrificial liner may be performed using an anisotropic etching process.

In an embodiment, the gate trench may be formed to include a fin portion upwardly protruding from a bottom surface of the gate trench and to expose opposing sidewalls of the fin portion.

In an embodiment, the sacrificial liner may be formed to cover the opposing sidewalls of the fin portion.

In an embodiment, forming the gate may include forming a gate layer on the gate dielectric layer to fill the gate trench, recessing the gate layer to form the gate filling a lower portion in the gate trench and to provide a groove in the gate trench on the gate, and forming a gate capping layer filling the groove.

In an embodiment, the gate dielectric layer may be formed to include a sacrificial liner oxide layer which is formed by oxidizing the sacrificial liner.

In an embodiment, the sacrificial liner may be formed by depositing a silicon nitride layer.

In an embodiment, the silicon nitride layer may be deposited by reacting a nitrogen source material with a silicon source material under a pressure of about 0.25 torr to about 1 torr and at a temperature of about 650° C. to about 710° C.

In an embodiment, the oxidation process applied to the sacrificial liner may be performed using a radical oxidation technique.

In an embodiment, the oxidation process applied to the sacrificial liner may be performed by supplying radicals of an oxidizing source material and radicals of a reducing source material onto the sacrificial liner under a pressure of about 0.5 torr to about 1 torr and at a temperature of about 750° C. to about 850° C.

In an embodiment, the sacrificial liner may be formed by depositing a silicon nitride layer using any one selected from the group consisting of a chemical vapor deposition (CVD) process and an atomic layer deposition (ALD) process.

In an embodiment, the semiconductor device may be any one selected from the group consisting of a DRAM device, a flash memory device and a resistive RAM device.

In an embodiment, the gate may be disposed in a gate trench formed in the active portion to provide a recessed region and the gate dielectric layer may extend into an interface between the gate and sidewalls of the gate trench.

In an embodiment, the gate dielectric layer may include a first portion on a bottom surface of the gate trench and a second portion on sidewalls of the gate trench. A thickness of the second portion may be greater than that of the first portion.

In an embodiment, the gate may extend to cover sidewalls of fin portion which is provided on a bottom surface of the gate trench, and the gate dielectric layer may extend into an interface between the gate and sidewalls of the fin portion.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Figure 1:
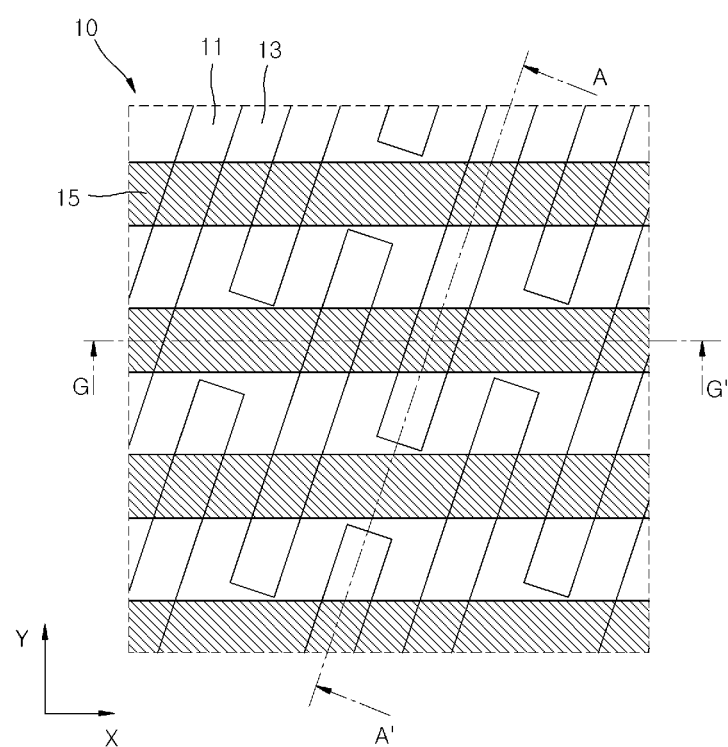
FIG. 1 is a layout illustrating a portion of a semiconductor device according to some embodiments.

The example embodiments may provide methods of suppressing loss or consumption of silicon atoms in active portions when a gate dielectric layer is formed on the active portions. Thus, it may prevent channel widths of transistors from being reduced during formation of the gate dielectric layer. As a result, characteristics of the transistors may be improved.

The terminology used herein is for the purpose of describing particular embodiments only and is not intended to be limiting of the embodiments. As used herein, the term "radical oxidation" may mean a process using a chemical reaction that an oxygen ($O_2$) gas is excited to generate oxygen radicals corresponding to free radicals and the oxygen radicals react on silicon atoms or silicon sources to oxidize a material including the silicon atoms or silicon sources. The radical oxidation may be categorized as either a thermal radical oxidation or a plasma radical oxidation according to a source (or energy) generating the free radicals. According to the radical oxidation, when an atmosphere in a reaction chamber is adjusted to maintain a low pressure of about 0.1 mTorr to several mTorr and an oxygen gas is supplied into the reaction chamber, the oxygen gas introduced into the chamber may be excited to generate oxygen radicals (e.g., oxygen atomic groups having unpaired electrons) and an oxidation process may be performed by the oxygen radicals. These oxygen radicals may have a mean free path which is greater than that of oxygen plasma having an ionized gaseous state. That is, the oxygen radicals may have a longer life time than the ions of the oxygen plasma. Thus, the oxygen radicals may participate in an oxidation reaction to form an oxide layer, for example, a silicon oxide layer. In the example embodiments, a mixture gas of an oxygen gas and a hydrogen gas may be used in the radical oxidation. In such a case, the hydrogen gas may act as a reduction source or a reduction agent, and hydrogen radicals as well as the oxygen radicals may also be generated. The oxygen radicals have a relatively high reactivity as compared with oxygen atoms of an oxygen gas used in a thermal oxidation process, the radical oxidation may exhibit a relatively low dependence on a silicon crystal plane. Thus, if a silicon oxide layer is formed on active portions using the radical oxidation, the silicon oxide layer may be formed to have a conformal thickness even though the active portions have uneven surfaces. When the silicon oxide layer is formed using the radical oxidation, Si—Si bonds in the silicon oxide layer may be easily broken. Thus, charge trap sites in the silicon oxide layer may be reduced to improve a film quality of the silicon oxide layer.

Although the present application is described in conjunction with cell transistors of the DRAM devices, the embodiments may be equally applicable to cell transistors or selection transistors of other semiconductor devices such as nonvolatile memory devices, for example, flash memory devices, phase changeable random access memory (PCRAM) devices, resistive random access memory (ReRAM) devices or scalable two transistor memory (SUM) devices. The semiconductor devices according to the embodiments may be integrated or realized on semiconductor substrates and may be encapsulated to form semiconductor packages or semiconductor modules which are employed in electronic systems. The electronic systems may correspond to personal computers (PCs), servers, or mobile systems (e.g., laptop computers, handheld computers or smart phones).

It will be understood that, although the terms first, second, etc. may be used herein to describe various elements, these elements should not be limited by these terms. These terms are only used to distinguish one element from another. Thus, a first element could be termed a second element without departing from the teachings of the present embodiments. It will also be understood that when an element is referred to as being "on," "above", "below," or "under" another element, it can be directly "on," "above", "below," or "under" the other element, respectively, or intervening elements may also be present.

Various example embodiments of the inventive concept will be described more fully hereinafter with reference to the accompanying drawings.

Referring to FIG. 1, a layout 10 of the semiconductor memory device may be configured to include an isolation region 13 disposed to define active regions 11, and word lines 15 disposed to substantially cross over the active regions 11 and the isolation region 13. The word lines 15 may act as gate electrodes of cell transistors of semiconductor memory devices. For example, the cell transistors may correspond to DRAM cell transistors. The active regions 11 may be disposed to be parallel with a diagonal direction in an X-Y plane to realize a DRAM cell layout having an area of $6F^2$ when the character "F" of the cell layout area $6F^2$ denotes a minimum feature size. When the word lines 15 are disposed to be parallel with an X-axis, bit lines (not shown) may be disposed to be parallel with a Y-axis perpendicular to the X-axis and the active regions 11 may be disposed to be parallel with a diagonal line which is non-parallel with the X-axis and the Y-axis. In such a case, each of the active regions 11 may intersect two adjacent word lines 15 according to the layout 10, and memory cells may be disposed at respective ones of intersections of the bit lines and the word lines 15. A method of fabricating cell transistors of a DRAM device using the layout 10 of FIG. 1 will be described with reference to cross sectional views of FIGS. 2 to 8.

Figure 2:
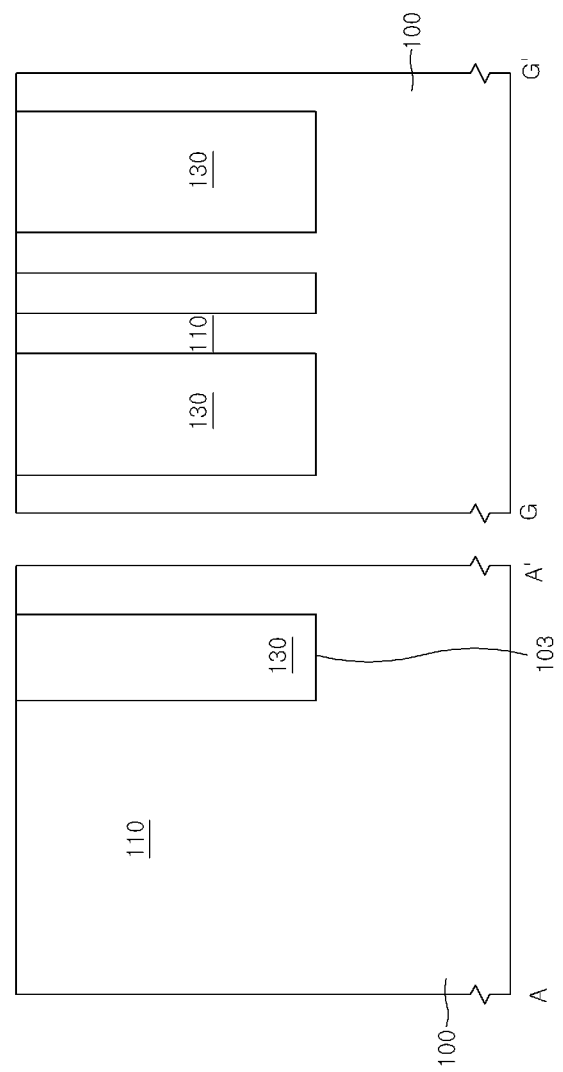
FIGS. 2 to 8 are merged cross sectional views taken along lines A-A' and G-G' of FIG. 1 that illustrate a method of fabricating a semiconductor device according to an embodiment and a semiconductor device fabricated thereby.

Referring to FIG. 2, an isolation layer 130 may be formed in a semiconductor substrate 100 to define active portions 110. The isolation layer 130 may be formed using, for example, a shallow trench isolation (STI) process. That is, the isolation layer 130 may be formed by etching the semiconductor substrate 100 corresponding to the isolation region 13 of the layout 10 shown in FIG. 1 to form an isolation trench 103 and filling the isolation trench 103 with an insulation layer. The active portions 110 may be portions of the semiconductor substrate 100, which correspond to the active regions 11 surrounding the isolation region 13.

Figure 3:
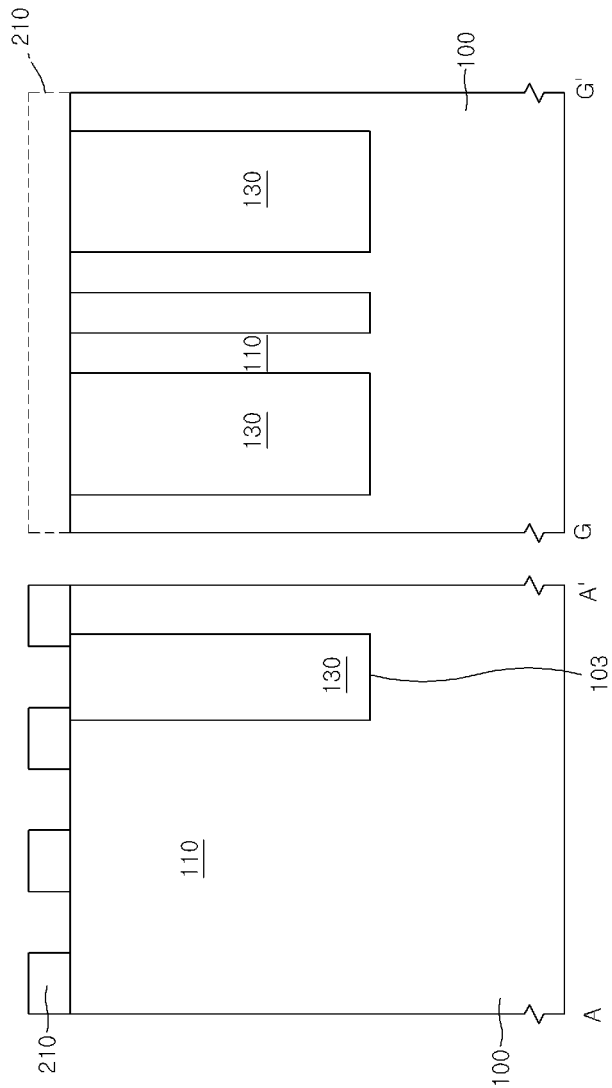

Referring to FIG. 3, an etch mask 210 for defining the word lines (not shown) may be formed on the substrate. For example, the etch mask 210 may be formed to include line-shaped openings exposing areas that correspond to the word lines 15 of FIG. 1. That is, the etch mask 210 may be formed to expose portions of the isolation layer 110 and portions of the active portions 110. The etch mask 210 may be a hard mask which is formed to include a silicon nitride ($Si_3N_4$) layer or a silicon oxide ($SiO_2$) layer. The etch mask 210 may be formed to have a line/space-shaped pattern, and the space regions of the etch mask 210 may correspond to the word lines 15 of FIG. 1.

Figure 4:
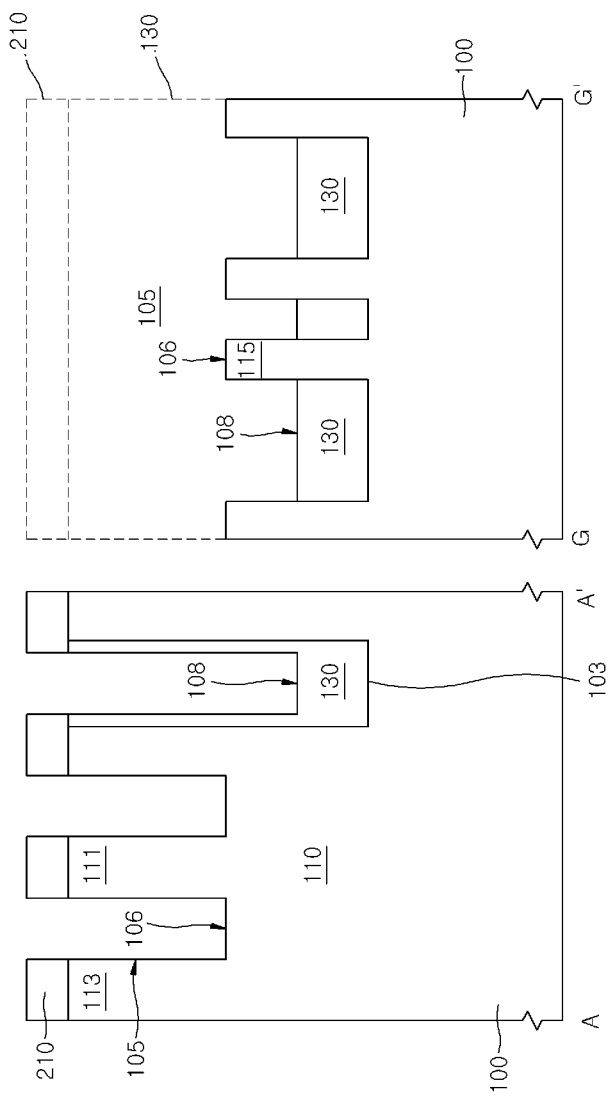

Referring to FIG. 4, the exposed portions of the active portions 110 and the exposed portions of the isolation layer 130 may be etched to form gate trenches 105 using the etch mask 210. That is, the gate trenches 105 may be formed by recessing portions of the active portions 110 and portions of the isolation layer 130, which are exposed by the etch mask 210. Upper portions 111 and 113 in the active portions 110, which are separated by the gate trenches 105 and covered by the etch mask 210, may be used as drain junction regions and source junction regions in which impurity ions are injected in a subsequent process.

Each of the gate trenches 105 may be formed to include first bottom surfaces 106 located in the active portions 110 and second bottom surfaces 108 located in the isolation layer 130. The first bottom surfaces 106 may correspond to surfaces (e.g., silicon material surfaces) of the recessed or etched active portions 110, and the second bottom surfaces 108 may correspond to surfaces (e.g., silicon oxide material surfaces or silicon nitride material surfaces) of the recessed or etched isolation layer 130. The second bottom surfaces 108 may be lower than the first bottom surfaces 106. Thus, opposing sidewalls of each of the recessed active portions 110 having the first bottom surfaces 106 may be exposed to provide an active fin portion 115 having a mesa shape, as illustrated in the G-G' cross sectional view of FIG. 4. Accordingly, when the gate trenches 105 are filled with buried gates in a subsequent process, the fin portions 115 may act as channel regions of fin-type field effect transistors (fin FETs). Since the fin portions 115 act as the channel regions, overlap areas between the channel regions and the buried gates may be increased. In particular, channel widths of the fin-type transistor may be remarkably increased as compared with transistors having general buried gates according to the fin portions 115. Therefore, if transistors (e.g., fin FETs) employing the fin portions 115 as channel regions are formed, drain currents of the transistors may increase to improve electrical characteristic of the transistors.

Figure 5:
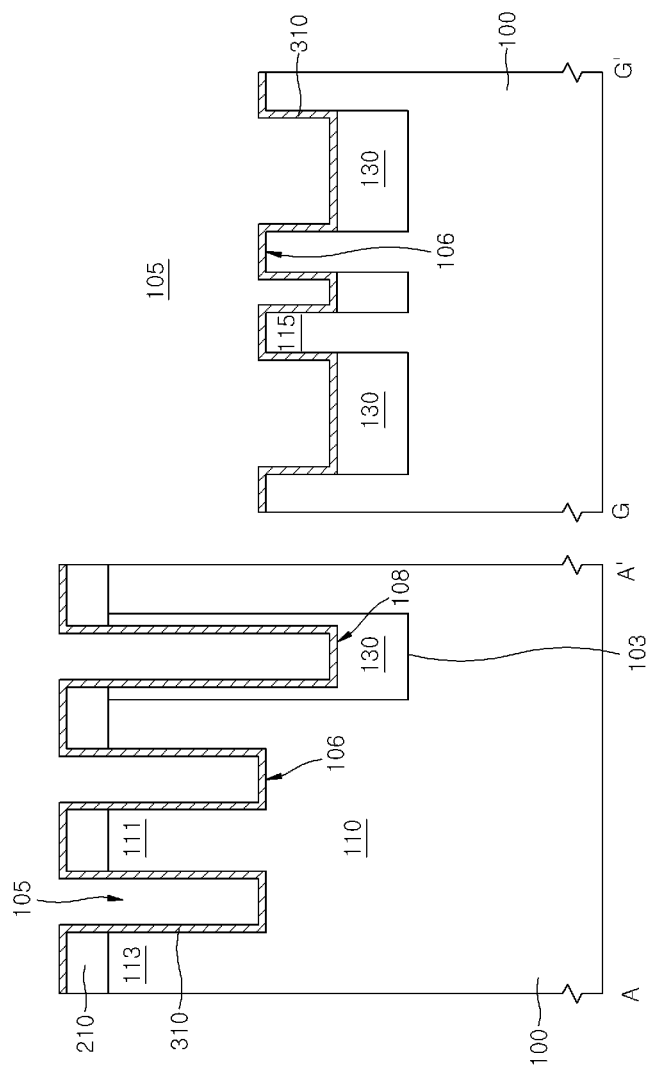

Referring to FIG. 5, a sacrificial liner 310 may be formed on an entire surface of the substrate including the gate trenches 105. The sacrificial liner 310 may be conformally formed along a surface profile of the gate trenches 105. That is, the sacrificial liner 310 may be formed to cover sidewalls of the gate trenches 105 and the first and second bottom surfaces 106 and 108 and may also extend to cover sidewalls of the fin portions 115 that relatively protrude to have mesa shapes. The sacrificial liner 310 may disturb the oxidation of the active portions 110 during a subsequent oxidation process, thereby suppressing the loss or consumption of silicon atoms in the active portions 110.

The sacrificial liner 310 may be formed by depositing a silicon nitride ($Si_3N_4$) layer. The sacrificial liner 310 formed of a silicon nitride ($Si_3N_4$) layer may be a sacrificial layer that is oxidized to change into an oxide material in a subsequent oxidation process. When the sacrificial liner 310 is formed of a silicon nitride ($Si_3N_4$) layer, the silicon nitride ($Si_3N_4$) layer may be deposited by reacting a nitrogen source material with a silicon source material under a pressure of about 0.25 torr to about 1 torr and at a temperature of about 650° C. to about 710° C. Under this process condition, the silicon nitride ($Si_3N_4$) layer may be formed to have a relatively low impurity concentration and/or a relatively low defect density. When the sacrificial liner 310 is formed of a silicon nitride ($Si_3N_4$) layer, an ammonia ($NH_3$) gas may be used as the nitrogen source material and a dichlorosilane ($SiCl_2H_2$) gas may be used as the silicon source material. Further, the silicon nitride ($Si_3N_4$) layer used as the sacrificial liner 310 may be formed by a chemical vapor deposition (CVD) process or an atomic layer deposition (ALD) process using an ammonia ($NH_3$) gas and a dichlorosilane ($SiCl_2H_2$) gas as process gases. The silicon nitride ($Si_3N_4$) layer used as the sacrificial liner 310 may be formed to have a thickness of about 10 angstroms to about 50 angstroms in consideration of a thickness of a gate dielectric layer to be formed in a subsequent process. Further, the silicon nitride ($Si_3N_4$) layer used as the sacrificial liner 310 may be formed to have a thickness of about 20 angstroms to about 30 angstroms.

Figure 6:
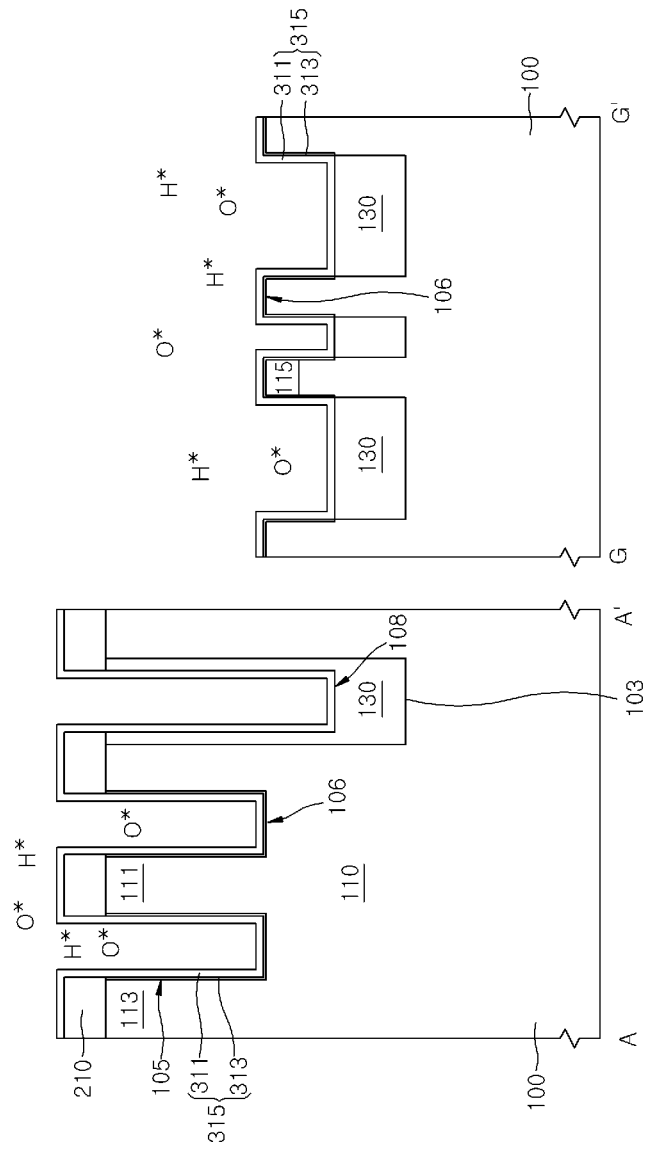

Referring to FIG. 6, the sacrificial liner (310 of FIG. 5) is oxidized to form a gate dielectric layer 315. During the oxidation process, the sacrificial liner 310 may be oxidized and may suppress the oxidation of the active portions 110 to prevent the silicon atoms in the active portions 110 from being lost or consumed. During the oxidation process, the sacrificial liner 310 may be oxidized to change into a sacrificial liner oxide layer 311 and the sacrificial liner oxide layer 311 may act as a portion of the gate dielectric layer 315. If the sacrificial liner 310 is over-oxidized, surfaces of the active portions 110 may also be oxidized to form an interfacial oxide layer 313. In such a case, the interfacial oxide layer 313 as well as the sacrificial liner oxide layer 311 may constitute the gate dielectric layer 315. Nevertheless, surfaces of the active portions 110 may not directly exposed to the oxidation process because of the presence of the sacrificial liner 310. Thus, growth of the interfacial oxide layer 313 may be effectively suppressed or delayed to reduce the loss or consumption of the silicon atoms in the active portions 110 during the oxidation process for forming the gate dielectric layer 315.

The oxidation process for forming the gate dielectric layer 315 may be performed using a radical oxidation technique in order to efficiently oxidize the sacrificial liner 310 into an oxide layer. The radical oxidation may be performed using a low pressure radical oxidation technique. For example, the low pressure radical oxidation may be performed by supplying an oxidizing source material and a reducing source material onto the sacrificial liner 310 under a pressure of about 0.5 torr to about 1 torr and at a temperature of about 750° C. to about 850° C. which is higher than a deposition temperature of a silicon nitride ($Si_3N_4$) layer used as the sacrificial liner 310. During the low pressure radical oxidation, an oxygen gas may be used as the oxidizing source material and a hydrogen gas may be used as the reducing source material. In such a case, oxygen radicals (O*) generated from the oxygen gas and hydrogen radicals (H*) generated from the hydrogen gas may be provided onto the sacrificial liner 310 formed of a silicon nitride ($Si_3N_4$) layer. Si—N bonds in the sacrificial liner 310 may be easily broken by the oxygen radicals (O*) and the hydrogen radicals (H*), and the oxygen radicals (O*) may combine with the silicon atoms in the sacrificial liner 310 to form Si—O bonds constituting a silicon oxide layer. In addition, the hydrogen radicals (H*) may prevent the nitrogen atoms in the sacrificial liner 310 from being oxidized. Further, the hydrogen radicals (H*) is combined with the nitrogen atoms to generate byproduct and the byproduct may be exhausted out of an apparatus in which the low pressure radical oxidation is performed. Accordingly, the sacrificial liner 310 may be successfully transformed into a silicon oxide layer, that is, the sacrificial liner oxidation layer 311. Further, if the sacrificial liner 310 formed of a silicon nitride ($Si_3N_4$) layer is transformed into the silicon oxide layer 311 using the low pressure radical oxidation technique nitrogen content in the silicon oxide layer may be minimized. Since a trace of the nitrogen component is detected at an interface between the active portions 110 and the sacrificial liner oxide layer 311. Therefore, the sacrificial liner oxide layer 311 formed by the radical oxidation technique may correspond to a pure silicon oxide layer.

As described above, the sacrificial liner 310 may be oxidized by the radical oxidation, and oxidation of the active portions 110 covered with the sacrificial liner 310 may be effectively suppressed. Thus, the growth of the interfacial oxide layer 313 may also be effectively suppressed or delayed during the radical oxidation for forming the gate dielectric layer 315. As a result, it may be possible to accurately control and reduce a thickness of the gate dielectric layer 315. A width of each fin portion 115 obtained after the radical oxidation is directly applied to the sidewalls of the fin portions 115 without the sacrificial liner 310 may be narrower than that of each fin portion 115 obtained after the sacrificial liner 310 is formed on the sidewalls of the fin portions 115 and the radical oxidation is applied to the sacrificial liner 310 to form the sacrificial liner oxide layer 311. This is because the sidewalls of the fin portions 115 are directly oxidized by the radical oxidation process if the sacrificial liner 310 is not formed on the sidewalls of the fin portions 115. In other words, if the sacrificial liner 310 is formed to cover the sidewalls of the fin portions 115 prior to the radical oxidation process, the sacrificial liner 310 may suppress the oxidation of the sidewalls of the fin portions 115 during the radical oxidation process. As a result, channel widths of fin FETs employing the fin portions 115 as channel regions can be increased, thereby reducing channel resistance thereof.

Figure 7:
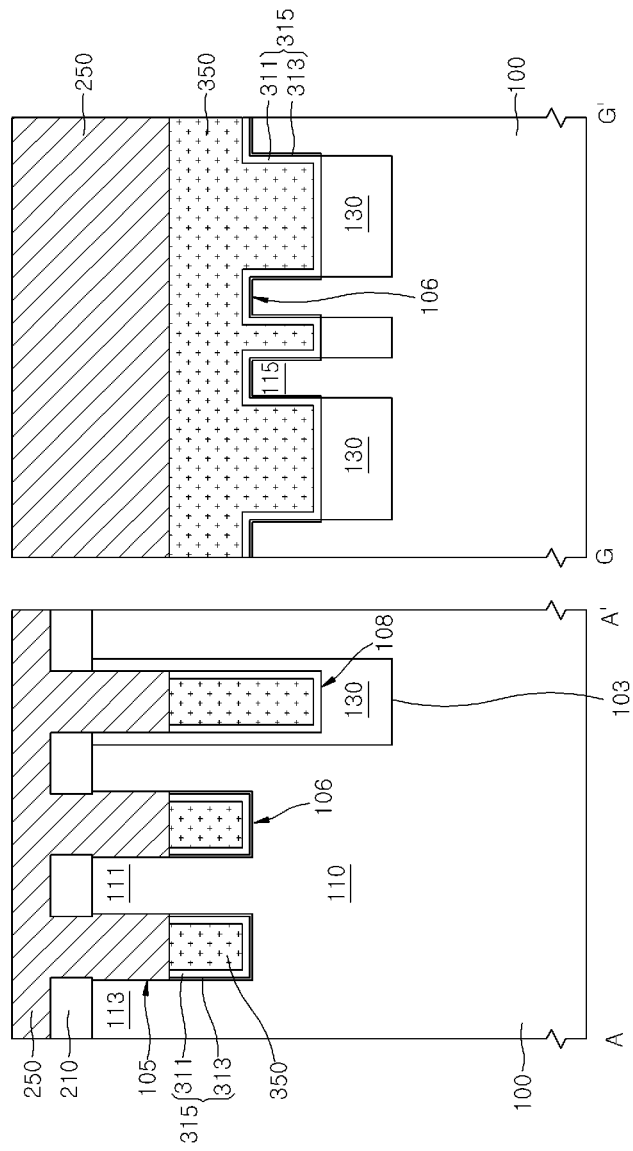

Referring to FIG. 7, gates 350 may be formed on the gate dielectric layer 315. Specifically, a gate layer may be formed on the gate dielectric layer 315 to fill the gate trenches 105, and the gate layer may be recessed using an etch back process to form the gates 350 filling respective ones of lower portions in the gate trenches 105. The gate layer may be etched back or recessed such that the gates 350 are disposed in respective ones of the gate trenches 105 and grooves or recessed regions corresponding to upper portions in the gate trenches 105 are provided on respective ones of the gates 350. A gate capping layer 250 may be formed on the gate 350. In more detail, the gate capping layer 250 may be formed in the grooves and on the etch mask 210, thereby forming buried gates. The gate capping layer 250 may be formed of an insulation layer, for example, a silicon nitride layer or a silicon oxide layer. Further, before the gate capping layer 250 is formed, impurity ions may be selectively injected into the drain junction regions 111 and the source junction regions 113 to form drain regions and source regions.

Figure 8:
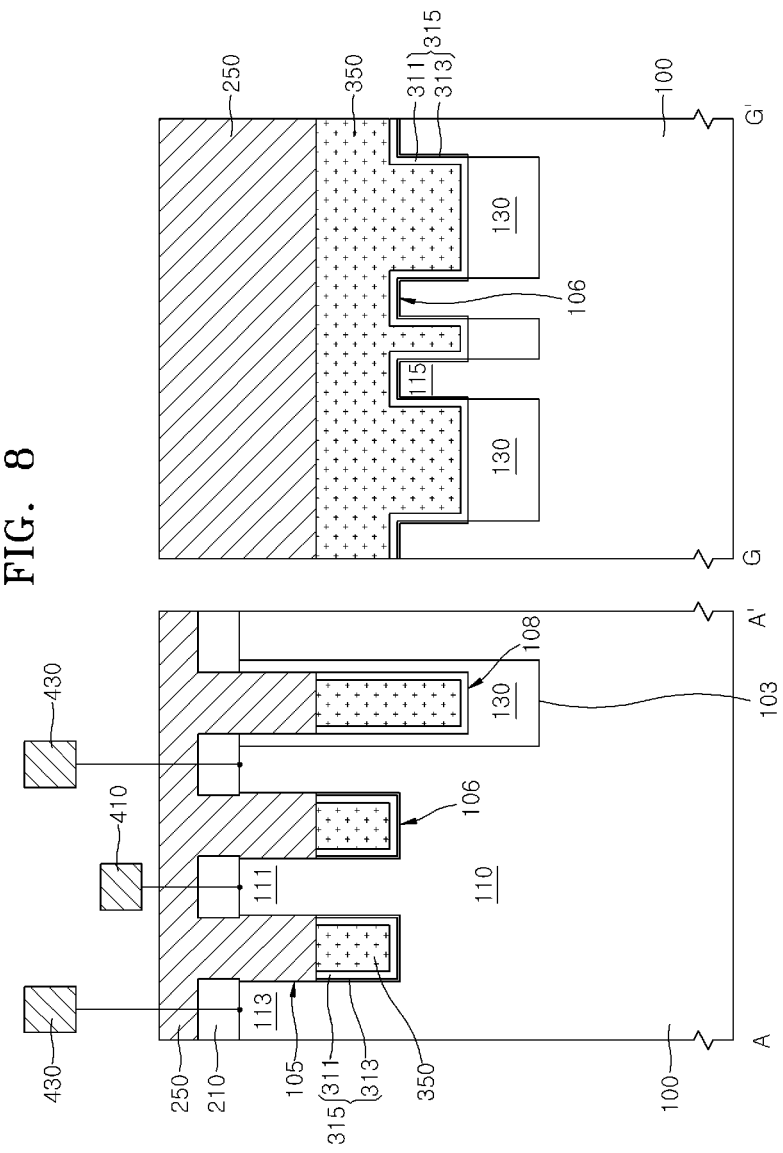

Referring to FIG. 8, bit lines 410 and data storage elements 430 may be formed on the substrate including the gate capping layer 250. The bit lines 410 may be formed to be electrically connected to the drain junction regions 111, and the data storage elements 430 may be formed to be electrically connected to respective ones of the source junction regions 113. When the semiconductor device is a DRAM device, the data storage elements 430 may be cell capacitors.

As illustrated in FIG. 8, the semiconductor device according to the embodiments may be substantially located on the active portions 110 of the semiconductor substrate 100. The semiconductor device may be configured to include the gate dielectric layer 315 having the sacrificial liner oxide layer 311 which is formed by oxidizing the sacrificial liner (310 of FIG. 5) using a radical oxidation technique. Further, the semiconductor device according to the embodiments may be configured to include the buried gates 350 disposed on the gate dielectric layer 315. Although the embodiment illustrated in FIG. 8 is described in conjunction with a semiconductor device including the buried gates 350 and the gate dielectric layer 315 located in the gate trenches 105 formed in the active portions 110, the gate dielectric layer 315 may be applicable to planar transistors including general gates. Further, the gate dielectric layer 315 may be disposed between the buried gates 350 and inner walls of the gate trenches 105.

As illustrated in FIG. 8, when the buried gates 350 are formed to cover top surfaces (e.g., the first bottom surfaces 106) and sidewalls of the fin portions 115 (that is, fin-shaped active portions), the gate dielectric layer 315 may be formed to extend into the interfaces between the gates 350 and the sidewalls of the fin portions 115.

In the embodiment, the gate dielectric layer 315 may be formed so that a thickness of the gate dielectric layer 315 formed on the sidewalls of the gate trenches 105 (e.g., the sidewalls of the pin portions 115) may be different from a thickness of the gate dielectric layer 315 formed on the first bottom surfaces 106.

Figure 9:
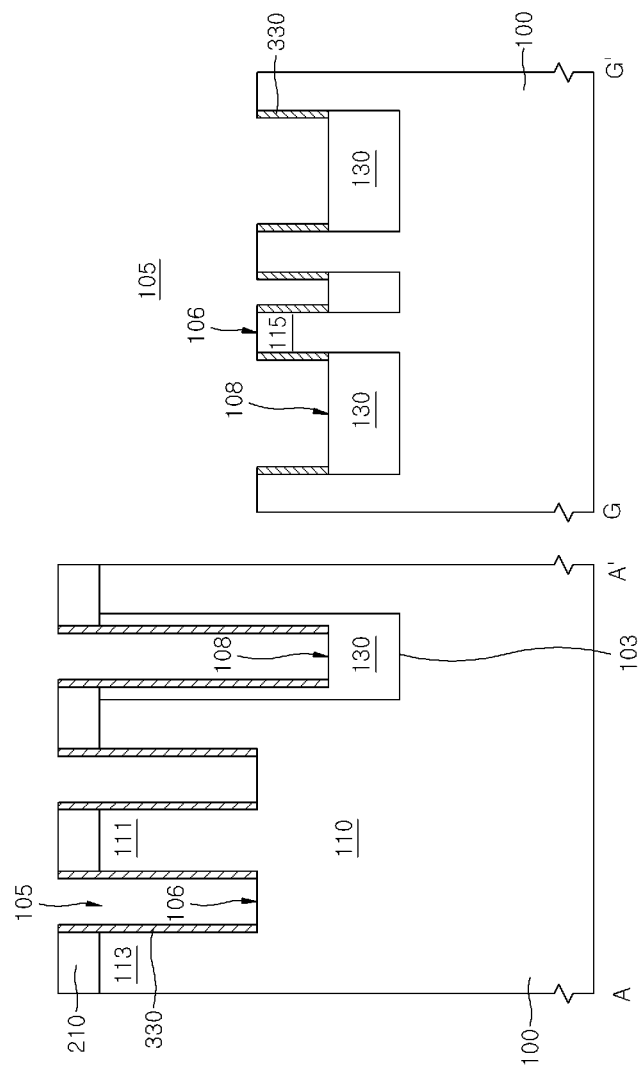
FIGS. 9, 10 and 11 are merged cross sectional views taken along lines A-A' and G-G' of FIG. 1 that illustrate a method of fabricating a semiconductor device according to another embodiment and a semiconductor device fabricated thereby.

Referring to FIG. 9, portions of the sacrificial liner 310 may be removed to be exposed the first and second bottom surfaces 106 and 108 and to form sacrificial liner spacers 330 on sidewalls of the gate trenches 105. Specifically, the sacrificial liner spacers 330 may be formed by etching the sacrificial liner 310 using an anisotropic etching process until the first and second bottom surfaces 106 and 108 are exposed. As well known, the anisotropic etching process may be performed using a dry etching technique. Since the sacrificial liner spacer 330 may be formed of the sacrificial liner 310, the sacrificial liner spacer 330 may be formed of a silicon nitride layer or a silicon oxide layer. The silicon oxide layer for forming the sacrificial liner spacer 330 may formed using a chemical vapor deposition (CVD) process or an atomic layer deposition (ALD) process. In such a case, the sacrificial liner spacers 330 formed of a silicon oxide layer may also suppress the oxidation of the active portions 110 during a subsequent oxidation process such as a radical oxidation process.

Accordingly, the sacrificial liner spacers 330 may suppress the oxidation of the active portions 110, thereby preventing silicon atoms in the active portions 110 from being lost or consumed during a subsequent oxidation process. When the sacrificial liner 310 (e.g., the sacrificial liner spacers 330) is formed to include a silicon oxide layer, defects in the sacrificial liner 310 (or the sacrificial liner spacers 330) may be removed during a subsequent radical oxidation process. The sacrificial liner spacers 330 may be formed to have spacer shapes and to cover sidewalls of the gate trenches 105 and sidewalls of the fin portions 115 that relatively protrude to have mesa shapes. That is, since the sacrificial liner spacers 330 is formed to surround the sidewalls of the gate trenches 105, it may prevent from the oxidation of the active portions 110 which are defined by the gate trenches 105.

Figure 10:
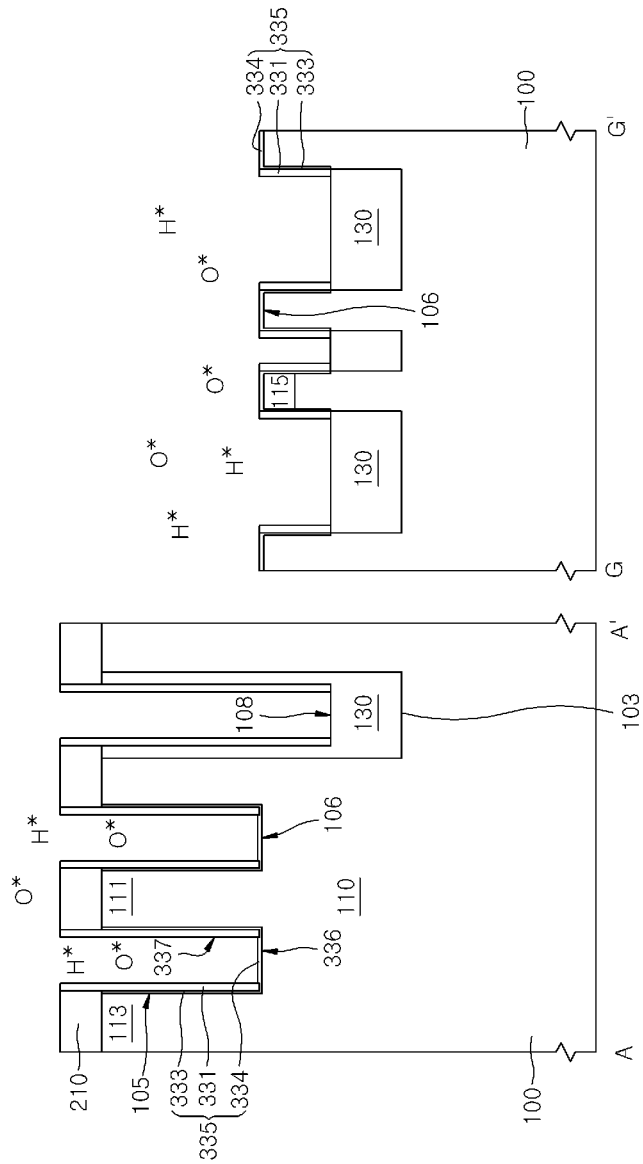

Referring to FIG. 10, a gate dielectric layer 335 is formed on a resultant structure of the semiconductor substrate 100. The gate electric layer 335 is formed by oxidation of the sacrificial liner spacers (330 of FIG. 9). The oxidation process for forming the gate dielectric layer 335 may be performed using the radical oxidation described with reference to FIG. 6. The sacrificial liner spacers 330 may be oxidized or cured during the oxidation process, thereby suppressing loss of silicon atoms in the fin portions 115. When the sacrificial liner spacers 330 are formed to include a silicon nitride layer, the sacrificial liner spacers 330 may be oxidized to transform into sacrificial liner oxide layers 331 during the oxidation process. Thus, the gate dielectric layer 335 including the sacrificial liner oxide layer 331 may be formed to substantially include a silicon oxide layer. When the sacrificial liner spacers 330 are formed to include a silicon oxide layer, the sacrificial liner spacers 330 may be re-oxidized or cured during the oxidation process to have more excellent oxide material properties.

If the sacrificial liner spacers 330 are oxidized, surfaces of the active portions 110 may also be oxidized to form interfacial oxide layers 333 between the sacrificial liner oxide layers 331 and the sidewalls of the active portions 110. In such a case, the interfacial oxide layer 333 as well as the sacrificial liner oxide layer 331 may constitute the gate dielectric layer 335. Nevertheless, the sidewalls of the active portions 110 may not be directly exposed to the oxidation process because of the presence of the sacrificial liner spacers 330. Thus, growth of the interfacial oxide layer 333 may be effectively suppressed or delayed to minimize the loss or consumption of the silicon atoms in the active portions 110 during the oxidation process for forming the gate dielectric layer 335.

Meanwhile, the first bottom surfaces 106 may be directly exposed to the oxidation process for forming the gate dielectric layer 335. Thus, bottom oxide layers 334 may be formed on the first bottom surfaces 106 during the oxidation process. The bottom oxide layers 334 may be grown on respective ones of the first bottom surfaces 106 which are exposed by the sacrificial liner spacers 330. Thus, the bottom oxide layer 334 may be formed to have a thickness which is less than a total thickness of the sacrificial liner oxide layer 331 and the interfacial oxide layer 333. The bottom oxide layer 334 may be included to the gate dielectric layer 335. Accordingly, the gate dielectric layer 335 may include a first portion 336 composed of the bottom oxide layer 334 formed on the first bottom surface 106 and a second portion 337 composed of the sacrificial liner oxide layer 331 and the interfacial oxide layer 333 formed on the sidewall of the gate trench 105, and a thickness of the gate dielectric layer 335 in the second portion 337 may be greater than that of the gate dielectric layer 335 in the first portion 336. That is, a thickness of the gate dielectric layer 335 may vary according to its position.

The active portions 110 below the first bottom surfaces 106 may be used as channel regions of transistors, and the bottom oxide layers 334 may be formed to be thinner than the second portions 337 of the gate dielectric layer 335 as described above. Thus, the transistors employing the bottom oxide layers 334 as gate dielectric layers may exhibit excellent characteristics, for example, a high drain current drivability and a low threshold voltage. As a result, the operating speed of the transistors may be improved. In contrast, the second portions 337 of the gate dielectric layer 335 adjacent to the drain and source junction regions 111 and 113 may be relatively thicker than the first portions 336 of the gate dielectric layer 335, as described above. In such a case, a junction leakage current characteristic (e.g., a gate induced drain leakage (GIDL) characteristic) of the drain regions formed in the drain junction regions 111 may be improved to enhance a refresh characteristic of memory cells of DRAM device. In conclusion, when the semiconductor device according to the embodiments corresponds to a DRAM device, the gate dielectric layer 335 may effectively improve a switching characteristic of DRAM cell transistors and a refresh characteristic of the DRAM device.

Figure 11:
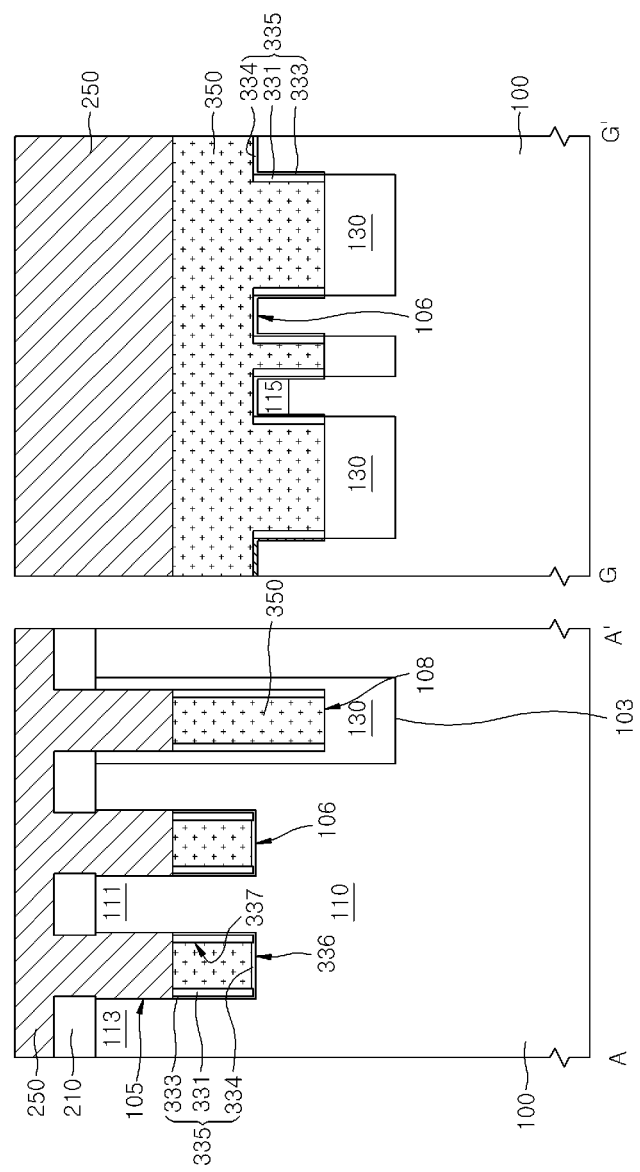

Referring to FIG. 11, gates 350 may be formed on the gate dielectric layer 335. The gates 350 may be formed using the same manners as described with reference to FIG. 7. Further, a gate capping layer 250 may be formed to cover the gates 350. The gate capping layer 250 may also be formed using the same manners as described with reference to FIG. 7. Subsequently, as described with reference to FIG. 8, bit lines (410 of FIG. 8) and data storage elements (430 of FIG. 8) may be formed on the substrate including the gate capping layer 250. The bit lines 410 may be formed to be electrically connected to the drain junction regions 111, and the data storage elements 430 may be formed to be electrically connected to respective ones of the source junction regions 113.

As illustrated in FIG. 11, the semiconductor device according to the embodiments may be substantially located on the active portions 110 of the semiconductor substrate 100 and may be configured to include the gate dielectric layer 335 having the sacrificial liner oxide layer 331 which is formed by oxidizing the sacrificial liner spacers (330 of FIG. 9) using a radical oxidation technique. Further, the semiconductor device according to the embodiments may be configured to include the buried gates 350 disposed on the gate dielectric layer 335. In addition, the gate dielectric layer 335 may be formed to include a first portion 336 composed of the bottom oxide layer 334 grown on the first bottom surface 106 and a second portion 337 composed of the sacrificial liner oxide layer 331 and the interfacial oxide layer 333 stacked on the sidewall of the gate trench 105. Further, the thickness of the gate dielectric layer 335 in the first portion 336 may be thinner than that of the gate dielectric layer 335 in the second portion 337. That is, the thickness of the gate dielectric layer 335 may vary according to its position. Although the embodiment illustrated in FIG. 11 is described in conjunction with a semiconductor device including the buried gates 350 and the gate dielectric layer 335 located in the gate trenches 105 formed in the active portions 110, the gate dielectric layer 335 may be applicable to planar transistors including general gates. In the present embodiment, the gate dielectric layer 335 may be disposed between the buried gates 350 and inner walls of the gate trenches 105.

As illustrated in FIG. 11, when the buried gates 350 are formed to cover top surfaces (e.g., the first bottom surfaces 106) and sidewalls of the fin portions 115, that is, fin-shaped active portions, the gate dielectric layer 335 may be formed to extend into the interfaces between the gates 350 and the sidewalls of the fin portions 115.

The methods of fabricating a semiconductor device and semiconductor devices fabricated thereby may be applicable to or employed in electronic systems, for example, computers, mobile phones or the like. The electronic system may be configured to include a main board and various semiconductor devices and/or semiconductor packages mounted on the main board. The main board may be a printed circuit board.

The electronic system may be configured to include an arithmetic processor, a memory unit, a storage unit, a video processor 1009 and a network adapter which are mounted on the main board to communicate with each other through a data bus. The arithmetic processor may be a microprocessor, and the memory unit may include a semiconductor package in which a memory semiconductor device (e.g., a DRAM device) according to one of the above embodiments and a logic semiconductor device for controlling the memory semiconductor device are stacked. Further, the storage unit may include a nonvolatile memory device and/or a hard disk, and the video processor may be a semiconductor package including memory chips such as video DRAM chips for temporarily storing video data and a video controller for processing/controlling the video data stored in the video DRAM chips. In addition, the network adapter may correspond to an interface unit. That is, the network adapter may transmit electrical data to an external communication network or may receive electrical data from the external communication network.

Program data stored in the storage unit may be loaded in the memory unit through the data bus and may be executed by the arithmetic processor. The storage unit may be configured to include a solid state disk (SSD, also referred to as a solid state drive) having a plurality of flash memory devices. In addition, the electronic system may further include an input device for receiving data and an output device for displaying data processed therein. The input device may include a keyboard or a touch sensitive display screen, and the output device may include a display monitor, a printer or a display screen. The electronic system may correspond to a personal computer, a server or a mobile system. The mobile system may include a laptop computer, a handheld computer or a smart phone.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of fabricating a semiconductor device, the method comprising:
forming a sacrificial liner on an active portion of a semiconductor substrate;
oxidizing the sacrificial liner to form a gate dielectric layer; and
forming a gate on the gate dielectric layer;
further comprising removing one portion of the sacrificial liner to be exposed a bottom surface of a gate trench before the gate dielectric layer is formed, wherein the gate dielectric layer includes a first portion having a first thickness and a second portion having a second thickness being thicker than the first thickness by removing the one portion of the sacrificial, wherein the first portion is located at the bottom surface of the gate trench and the second portion is located at the sidewalls of the gate trench.

2. The method of claim 1, further comprising forming the gate trench in the active portion before the sacrificial liner is formed on the active portion,
wherein the sacrificial liner is formed along an inner surface of the gate trench and the gate is formed in the gate trench.

3. The method of claim 1, wherein removing the one portion of the sacrificial liner is performed using an anisotropic etching process.

4. The method of claim 2, wherein the gate trench is formed to include a fin portion upwardly protruding from a bottom surface of the gate trench and to expose opposing sidewalls of the fin portion.

5. The method of claim 4, wherein the sacrificial liner is formed to cover the opposing sidewalls of the fin portion.

6. The method of claim 2, wherein forming the gate includes:
forming a gate layer on the gate dielectric layer to fill the gate trench;
recessing partial thickness of the gate layer to form the gate filling a lower portion in the gate trench and to provide a groove in the gate trench on the gate; and
forming a gate capping layer filling the groove.

7. The method of claim 1, wherein the sacrificial liner is formed by depositing a silicon nitride layer.

8. The method of claim 7, wherein the silicon nitride layer is deposited by reacting a nitrogen source material with a silicon source material under a pressure of about 0.25 torr to about 1 torr and at a temperature of about 650° C. to about 710° C.

9. The method of claim 1, wherein the oxidation of the sacrificial liner is performed using a radical source.

10. The method of claim 1, wherein the oxidation of the sacrificial liner is performed by supplying radicals of an oxidizing source material and radicals of a reducing source material onto the sacrificial liner under a pressure of about 0.5 torr to about 1 torr and at a temperature of about 750° C. to about 850° C.

11. The method of claim 1, wherein the sacrificial liner is formed by depositing a silicon nitride layer using a chemical vapor deposition (CVD) process or an atomic layer deposition (ALD) process.

12. The method of claim 1, wherein the semiconductor device is a DRAM device, a flash memory device or a resistive RAM device.

13. A method of fabricating a semiconductor device, the method comprising:
forming an isolation layer in a semiconductor substrate to define an active portion;
forming a gate trench that crosses the active portion and extends into the isolation layer to have a first bottom surface in the active portion and a second bottom surface in the isolation layer, the second bottom surface being lower than the first bottom surface to provide an active fin portion below the first bottom surface in the gate trench;
forming a sacrificial liner on an inner surface of the gate trench;
oxidizing the sacrificial liner to form a gate dielectric layer; and
forming a gate layer on the gate dielectric layer.

14. The method of claim 13, further comprising removing one portion of the sacrificial liner to leave the other portion of the sacrificial liner on sidewalls of the gate trench and the active fin portion and to expose the first bottom surface of the gate trench before the gate dielectric layer is formed, wherein while the sacrificial liner is oxidized, the bottom surface of the gate trench is oxidized to form a first portion of the gate dielectric layer and the sacrificial liner left on the sidewalls of the gate trench is oxidized to form a second portion of the gate dielectric layer, and wherein a thickness of the second portion is greater than that of the first portion.

\* \* \* \* \*